United States Patent [19]
Smith et al.

[11] Patent Number: 5,164,699
[45] Date of Patent: Nov. 17, 1992

[54] VIA RESISTORS WITHIN-MULTI-LAYER, 3 DIMENSIONAL STRUCTURES SUBSTRATES

[75] Inventors: Hal D. Smith, Rancho Palos Verdes; Robert F. McClanahan, Valencia; Andrew A. Shapiro, Orange; Raymond Brown, Fountain Valley, all of Calif.

[73] Assignee: Hughes Aircraft Company, Los Angeles, Calif.

[21] Appl. No.: 628,813

[22] Filed: Dec. 17, 1990

[51] Int. Cl.$^5$ ............................................. H01C 1/012
[52] U.S. Cl. .................................... 338/310; 338/307; 338/308; 338/314
[58] Field of Search ................. 338/310, 308, 314, 307

[56] References Cited
U.S. PATENT DOCUMENTS
4,300,115 11/1981 Ansell et al. .......................... 338/314

Primary Examiner—Marvin M. Lateef
Attorney, Agent, or Firm—Leonard A. Alkov; Wanda K. Denson-Low

[57] ABSTRACT

Via resistor structures in a hybrid multilayer circuit having a plurality of insulating layers. One via resistor structure includes a plurality of resistive via fills in vias in respective adjacent insulating layers, a plurality of conductive elements for electrically contacting predetermined tops and bottoms of the resistive via fills, and conductive via fills for providing external electrical connection to selected ones of the conductive elements at locations on the outside the unitized multilayer circuit structure. A further via resistor structure includes a resistive via fill formed in a via in one of the insulating layers, and one or more thermally conductive via fills for thermally conducting heat from said resistive via fill to the outside of the unitized multilayer circuit structure. Another via resistor structure comprises ratioed via resistors comprising a plurality of resistive via fills formed in respective vias in one of the insulating layers, said vias having substantially the same thickness and having respective cross-sectional areas selected to provide resistance values having predetermined ratios.

13 Claims, 2 Drawing Sheets

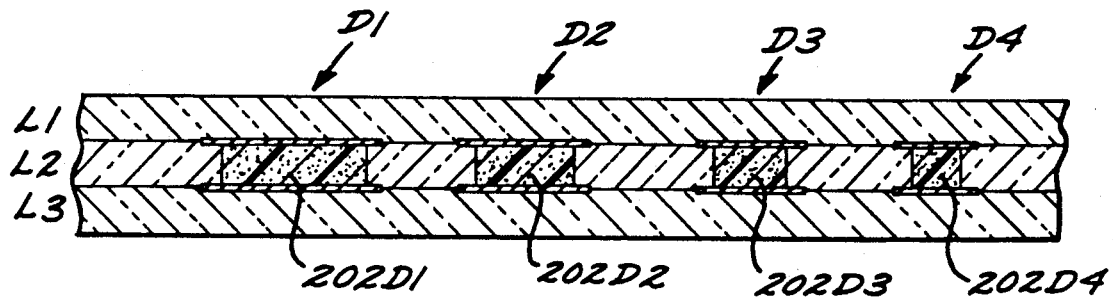
FIG.4
FIG.5
FIG.6
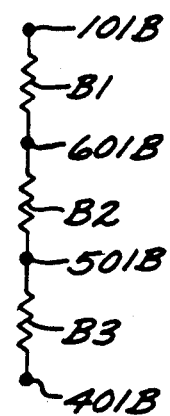

VIA RESISTORS WITHIN-MULTI-LAYER, 3 DIMENSIONAL STRUCTURES SUBSTRATES

BACKGROUND OF THE INVENTION

The disclosed invention is directed generally to hybrid multilayer circuit structures, and is directed more particularly to hybrid multilayer circuit structures having resistors formed in the vias thereof.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on a insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

The traditional thick film process for making resistors involves screen printing of resistive ink in a horizontal pattern where length, width and thickness are controlled to define resistance value.

A consideration with screen printed resistors is the difficulty in controlling their values, and the requirement for precision capacitors is met by mounting discrete resistors on the top insulating layer along with other discrete devices, and/or by forming screen printed resistors on the top layer which are trimmed, for example, by laser or abrasive trimming. The requirement for precision capacitors has also been met by formation and trimming of buried screen printed resistors, as disclosed in commonly assigned U.S. Pat. No. 4,792,779.

A further consideration with screen printed resistors as well as discrete resistors is the substrate area utilized by such components.

SUMMARY OF THE INVENTION

It would therefore be an advantage to provide for resistors for multilayer hybrid circuits having reduced substrate space requirements.

Another advantage would be to provide for resistors for multilayer hybrid circuits having precisely controllable values as well as precisely controllable ratios.

The foregoing and other advantages are provided by the invention in via resistor structures implemented in a unitized multilayer circuit having a plurality of insulating layers. A disclosed via resistor structure includes a plurality of resistive via fills in vias in respective adjacent insulating layers, a plurality of conductive elements for electrically contacting predetermined tops and bottoms of the resistive via fills, and conductive via fills for providing external electrical connection to selected ones of the conductive elements at locations on the outside the unitized multilayer circuit structure. A further via resistor structure includes a resistive via fill formed in a via in one of the insulating layers, and one or more thermally conductive via fills for thermally conducting heat from said resistive via fill to the outside of the unitized multilayer circuit structure. Another via resistor structure comprises ratioed via resistors comprising a plurality of resistive via fills formed in respective vias in one of the insulating layers, said vias having substantially the same thickness and having respective cross-sectional areas selected to provide resistance values having predetermined ratios.

BRIEF DESCRIPTION OF THE DRAWINGS

The advantages and features of the disclosed invention will be readily appreciated by persons skilled in the art from the following detailed description when read in conjunction with the drawing wherein:

FIGS. 1 through 4 are schematic sectional views of illustrative examples of via resistor structures in accordance with the invention.

FIGS. 5 and 6 are circuit schematics of the via resistor structures respectively illustrated in FIG. 1 and FIGS. 2A, 2B.

DETAILED DESCRIPTION OF THE DISCLOSURE

Figure 1:
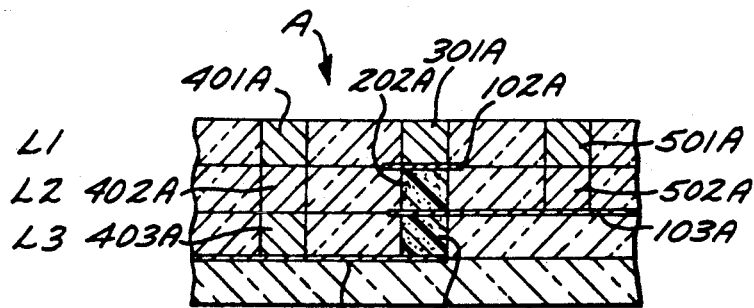

In the following detailed description and in the several figures of the drawing, like elements are identified with like reference numerals.

Via resistor structures in accordance with the invention are implemented in a unitized multilayer circuit structure that is utilized for interconnecting various discrete circuits mounted on the outside of the unitized structure. The unitized multilayer circuit structure is formed from a plurality of insulating layers (comprising ceramic, for example), conductive traces disposed between the layers, and conductive vias formed in the layers which together with any buried elements (e.g., elements formed on the top of an insulating layer and covered by an overlying insulating layer) are processed to form an integrally fused unitized multilayer structure. The discrete circuits are typically mounted and electrically connected on the outside of the unitized multilayer circuit structure after the unitizing fabrication.

FIGS. 1 through 4 schematically depict the implementation of illustrative examples of via resistor structures in accordance with the invention. Each via resistor includes a resistive via fill, a first electrically conductive element in contact with the top of the resistive via fill, and a second electrically conductive element in electrical contact with the resistive via fill. Each of the electrically conductive elements can comprise a conductive trace, a conductive via fill, or an external contact connection such as a conductive epoxy connection.

In the following description, the different elements of the via resistor structures will be referenced as follows. Conductor traces are identified by reference numerals in the form of 10XY, wherein X is the layer number on which the trace is formed (for example, pursuant to single side printing on the top side of each insulating layer) and Y is the particular resistor structure A, B, C, or D. Resistive via fills are identified by reference numerals in the form of 20XY, wherein X is the layer number in which the via fill is formed and Y is the particular resistor structure A, B, C, or D. Standard electrically conductive via fills are identified by reference numerals in the form of 30XY, 40XY, 50XY, 60XY wherein X is the layer number in which the via fill is formed and Y is the particular resistor structure A, B, C, or D. Thermally conductive via fills are identified by the reference numerals in the form of 90XY wherein X is the layer number in which the via fill is formed and Y is the particular resistor structure A, B, C, or D. To avoid ambiguity, the thermally conductive via fills are explicitly referenced with the terms "thermally" or "thermal".

FIG. 1 illustrates a stacked via resistor structure A that includes a resistive via fill 202A formed in a via in the layer L2 and a resistive via fill 203A formed in a via in the layer L2. A conductive trace 102A overlies the resistive via fill 202A, a conductive trace 103A underlies the resistive via fill 202A and overlies the resistive via fill 203A, and a conductive trace 104A underlies the resistive via fill 203A. A conductive via fill 301A overlies the conductive trace 102A and extends to the outside of the unitized multilayer structure and is available for external electrical connection. It should be appreciated that the conductive trace 102A can be eliminated if it is not necessary for the particular application, in which case the conductive via fill 301A would directly contact the resistive via fill 202A.

Standard conductive via fills 401A, 402A, 403A are electrically connected to the conductive trace 104A to provide electrical access to the conductive trace by external connection to the conductive via fill 401A which extends to the outside of the unitized multilayer circuit structure and is available for external connection. Standard conductive via fills 501A, 502A are electrically connected to the conductive trace 103A to provide electrical access to the conductive trace by external connection to the conductive via fill 501A which extends to the outside of the unitized multilayer circuit structure and is available for external connection. Effectively, the conductive vias electrically connect the resistors to the outside of the unitized multilayer circuit structure where external connections can be made.

By appropriate internal connections of conductor traces and/or external connections, the resistors in the resistor structure A can be connected in parallel or serial configurations, or they can be individually shorted.

An equivalent circuit of the via resistor structure A is shown in FIG. 5, with the terminals of the resistors identified by the reference numerals of the conductive via fills that are available for external electrical connection on the outside of the unitized multilayer circuit structure. Connection of the conductive via fill 401A to the conductive via fill 301A, for example, by wire bonding, connects the resistors A1 and A2 in parallel. Connecting the conductive via fill 301A to the conductive via fill 501A shorts the resistor A1.

Figure 2A:
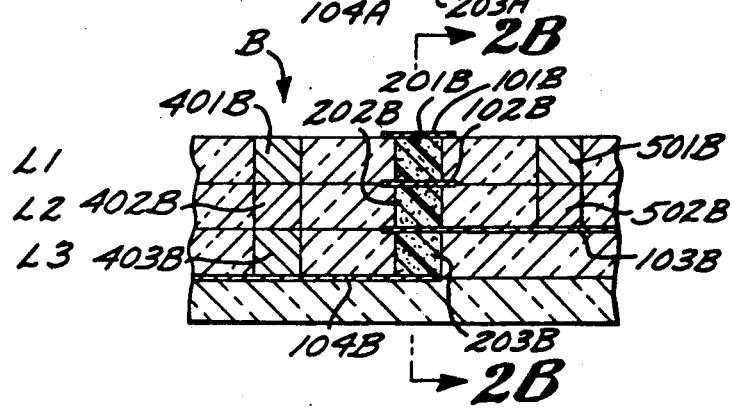
Figure 2B:
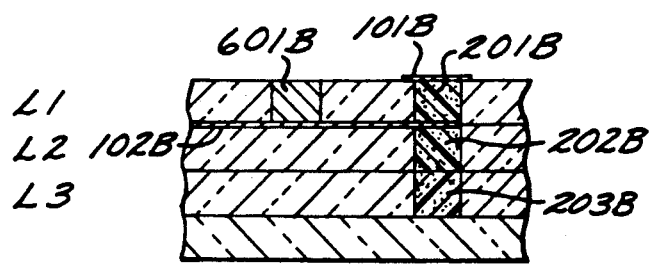

FIGS. 2A and 2B illustrate a stacked via resistor structure B that includes a resistive via fill 201B formed in a via in the layer L1, a resistive via fill 202B formed in the layer L2, and a resistive via fill 203B formed in the layer L3. The resistor structure further includes a conductor trace 101B that overlies the resistor via fill 201B, a conductor trace 102B that underlies the resistive via fill 201B and overlies the resistive via fill 202B, a conductor trace 103B that underlies the resistive via fill 202B and overlies the resistive via fill 203B, and a conductive trace 104B that underlies the resistive via fill 203B. It should be appreciated that another contact such as a conductive epoxy connection can be substituted for the conductor trace 101B.

Standard conductive via fills 401B, 402B, 403B are electrically connected to the conductive trace 104B to provide electrical access to the conductive trace by external connection to the conductive via fill 401B which extends to the outside of the unitized multilayer circuit structure and is available for external electrical connection. Standard conductive via fills 501B, 502B are electrically connected to the conductive trace 103B to provide electrical access to the conductive trace by external electrical connection to the conductive via fill 501B which extends to the outside of the unitized multilayer circuit structure and is available for external electrical connection.

By appropriate internal connections of conductor traces and/or external connections, the resistors in the resistor structure B can be connected in parallel or serial configurations, or they can be individually shorted.

An equivalent circuit of the via resistor structure B is shown in FIG. 6, with the terminals of the resistors identified by the reference numerals of the conductor trace 101B and the conductive via fills that are available for physical external connections on the outside of the unitized multilayer circuit structure. External connection of the conductive via fill 501B to the conductive trace 101B connects the resistors B1 and B2 in parallel. External connection of the conductive trace 101B to the conductive via fill 601B shorts the resistor B1. External connection of the conductive via fill 401B to the conductive via fill 601B connects the resistors B2 and B3 in parallel. The resistors can be configured in series by respective connections to the conductive trace 101B and the conductive via fill 401B without connections to the conductive via fills 501B, 601B.

For via resistor stacks having a larger number of via resistors, the capability for external electrical connections on the outside of the unitized multilayer circuit structure can be provided by respective axially aligned conductive vias for selected buried conductive traces in contact with the via resistors, wherein the conductive vias for each selected buried trace extends upwardly from the trace through the top layer L1. By way of illustrative example, the via structures comprising respective aligned vias can be arranged in a circular pattern around the axis of the aligned resistive via fills of the resistor structure, with each conductive via structure extending downwardly to a different layer, which would be an extension of the externally accessible via structure of the resistor structure of FIGS. 2A, 2B.

It should be appreciated that, depending on factors affecting the electrical and thermal integrity of the unitized multilayer circuit structure, the stacked resistors of the via resistor structures A and B can be axially aligned or staggered wherein via resistor fills in any two adjacent layers are not axially aligned.

It should be also appreciated that laterally separated via resistor structures in accordance with the invention can be interconnected by external connections on the outside of the unitized multilayer circuit structure, and that interconnection can also be made by selectively cutting conductive traces on the top layer that are formed as part of the unitizing multilayer structure fabrication so as to selectively sever electrical connections between conductive via fills and/or resistor via fills. For example, a plurality of via resistors could be connected in a parallel circuit by conductive traces on the outside of the unitized multilayer circuit structure, and selected resistors could be removed from the circuit by cutting appropriate conductor traces by laser cutting or abrasion, for example.

While the foregoing has shown a via resistor structure with resistive via fills in adjacent layers being separated by intervening conductor traces, it should be appreciated that via resistor structures in accordance with the invention can include a plurality of axially aligned stacked resistive via fills without intervening conductive traces. In other words, the conductor traces are located as required to achieve the desired resistance values and interconnection capabilities.

Figure 3:
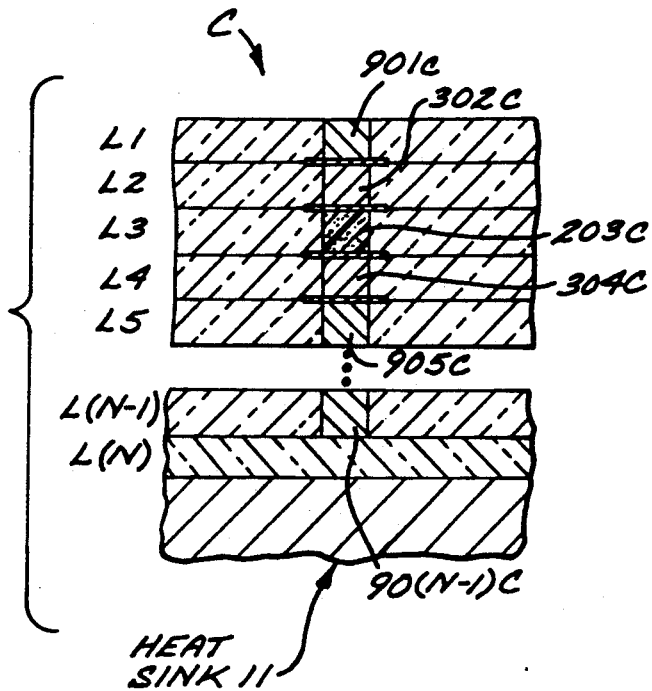

Referring now to FIG. 3, set forth therein is a via resistor structure C which includes a low thermal resistance path for transferring thermal energy from the resistor structure to the outside of the unitized multilayer circuit structure in which the resistor structure is implemented. The resistor structure C includes a resistor via fill 202C, a conductive via 302C overlying the resistor via fill 202C, and a conductive via fill 304C underlying the resistor via fill 202C. A thermal via fill 901C, which can comprise the same material as conductive via fills, overlies the conductive via fill 302C. A plurality of thermal via fills 905C, ... 90(N-1)C underlie the conductive via fill 304C. An electrical isolation layer L(N) electrically isolates the lower most thermal via fill 90(N1)C from a heat sink 11. Appropriate conductive traces, not shown, can be utilized for interconnection to the via resistor formed by the resistive via fill 203C. The thermal via fills can also comprise metal matrix composite inserts.

The thermal vias in combination with the electrically conductive vias provide low thermal resistance paths to the outside of the unitized multilayer circuit structure that transfer heat from the via resistor so as to reduce the temperature of the via resistor and the surrounding region. It should be appreciated that although the via resistor structure C includes two via thermal paths, a single thermal path can also be utilized. Also, if heat sinking is available on the top of the unitized multilayer circuit structure, the top thermal via can be thermally connected thereto through an electrically insulating layer.

The values of the via resistors in the via resistor structures are controlled by (a) the cross-sectional area of the filled vias, (b) the electrical characteristics of the resistive via fill material, and/or (c) the number and thicknesses of resistive via fills between the electrical contacts of a resistor, wherein the thickness of a resistive via fill is determined by the thickness of the insulating layer in which it is formed.

Ratioed resistors (i.e., resistors whose values have predetermined ratios relative to each other) are readily made by appropriately varying the diameter of the vias for the resistive via fills or utilizing resistive via fill materials having different resistivities. Thus, for example, for a given resistive via fill material and the same via fill thickness, a via resistor having a resistive via fill that has twice the cross-sectional area of another resistor would have a resistance value that is one-half the resistance value of such other resistor. As another example, for a given resistive via fill material and the same via cross-sectional area, a via resistor having twice the thickness of another resistor would have a resistance value of twice that of such other resistor.

Ratioing can also be achieved by appropriate connections of the resistors in a stacked resistor structure wherein all via resistors in the stack have the same via dimensions and the same resistive via fill material. For example, two of such via resistors connected serially would provide twice the resistance of one of the stacked resistors, three of such via resistors connected serially would provide three times the resistance of the one of the stacked resistors, and so forth.

Precisely ratioed resistors are advantageously provided with via resistors formed in the same layer and having the same resistor via fill material and the same thickness. Referring in particular to FIG. 4, schematically illustrated therein is a resistor structure D that includes a plurality of ratioed via resistors D1, D2, D3, D4 formed in a layer L2 of a unitized multilayer circuit structure and respectively comprising resistive via fills 202D1, 202D2, 202D3, 202D4. Electrical connections to the via resistor are made by appropriate conductive traces and/or conductive via fills as discussed and illustrated above. Also, each of the resistors can be thermally conductively connected to the outside of the unitized multilayer circuit by conductive and/or thermal vias as discussed above relative to FIG. 3.

The via resistors D1, D2, D3, D4 are formed in same layer of the same resistor via fill material and have the same thicknesses. The ratioed values of the resistors are controlled by the ratios of their cross-sectional areas. For example, for circular cross-sections that decrease from the resistor D1 to the resistor D4, the values of the resistors can be made to increase by a factor of 2 by controlling the via diameters to decrease by a factor of $1/(2)^{\frac{1}{2}}$ (i.e., the inverse of the square root of 2). In particular, if the resistor D1 has a via diameter d and a resistance value R, the resistor D2 would have a value of 2R by making its via diameter equal to $d/(2)^{\frac{1}{2}}$. The resistor D3 would have a value of 4R by making its via diameter equal to $d/[(2)^{\frac{1}{2}}(2)^{\frac{1}{2}}]$ (i.e., d/2). The resistor D4 would have a value of 8R by making its via diameter equal to $d/[2(2)^{\frac{1}{2}}]$.

By way of illustrative example, the vias for ratioed resistors in the same layer can be accurately formed with diamond tip mechanical punches whose diameters have been machined to high tolerances so as to precisely define the ratios of the via resistors.

Examples of circuits that can be advantageously implemented with via resistor structures in accordance with the invention include voltage divider networks for generating reference voltages, digital-to-analog converter circuits, analog voltage summing circuits, and attenuator circuits.

The conductive via fills can comprise standard conductive via fill material as traditionally utilized for interconnections, and examples of commercially available resistive via fill materials include DuPont 1900 Series resistor inks, DuPont 4700 Series resistor inks, DuPont 5900 Series resistor inks, and Ferro 85-xxx Series resistor inks. As indicated above, the thermal vias can comprise standard conductive via fill material or metal matrix composite inserts.

The resistor structures in accordance with the invention are made, for example, pursuant to low temperature cofired processing such as disclosed in "Development of a Low Temperature Co-fired Multilayer Ceramic Technology," by William A. Vitriol et. al., 1983 ISHM Proceedings, pages 593–598; "Processing and Reliability of Resistors Incorporated Within Low Temperature Co-fired Ceramic Structures," by Ramona G. Pond et. al., 1986 ISHM Proceedings, pages 461–472; and "Low Temperature Co-Fireable Ceramics with CoFired Resistors," by H. T. Sawhill et. al., 1986 ISHM Proceedings, pages 268-271.

In accordance with low temperature co-fired processing, vias are formed in a plurality of green thick film tape layers at locations defined by the desired via configurations of the desired multilayer circuit. The vias are filled with the appropriate conductive and resistive fill material, for example, by screen printing. Conductor metallization for conductive traces including those that contact the via resistors are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate.

The foregoing has been a disclosure of a via resistor structure for multilayer hybrid circuits which advantageously utilizes vias to provide for increased circuit packing density and which easily provides for precision and ratioed resistors. The via resistor structure of the invention further provides for resistor circuitry whose connections can be modified after fabrication of the hybrid in which they are implemented. The foregoing has also been a disclosure of a via resistor structure that includes thermally conductive paths for dissipating resistor heat.

Although the foregoing has been a description and illustration of specific embodiments of the invention, various modifications and changes thereto can be made by persons skilled in the art without departing from the scope and spirit of the invention as defined by the following claims.

What is claimed is:

1. A resistor structure in a cofired unitized multilayer circuit structure having a plurality of insulating layers formed of insulating tape, comprising:
   a plurality of resistive via fills in vias in respective adjacent insulating layers forming respective via resistors having precisely controlled resistance values;
   a plurality of conductive means for electrically contacting predetermined tops and bottoms of the resistive via fills; and
   electrical connection means for providing external electrical connection to selected ones of said conductive means at locations on the outside the unitized multilayer circuit structure.

2. The resistor structure of claim 1 wherein said conductive means comprises a conductive via fill or a conductive trace.

3. The resistor structure of claim 1 wherein said electrical connection means includes a conductive via fill which extends to the outside of the unitized multilayer circuit structure.

4. The resistor structure of claim 1 wherein said plurality of resistive via fills are configured to provide resistance values having predetermined ratios relative to each other.

5. The resistor structure of claim 4 wherein said ratios are controlled by the cross-sectional areas of said resistive via fills.

6. The resistor structure of claim 4 wherein said ratios are controlled by the characteristics of the material utilized for said resistive via fills.

7. The resistor structure of claim 4 wherein said ratios are controlled by the thicknesses of said resistive via fills.

8. A resistor structure in a cofired unitized multilayer circuit structure having a plurality of insulating layers formed of insulating tape, comprising:
   a resistive via fill formed in a via in one of the insulating layers and forming a via resistor having a precisely controlled resistance value; and
   one or more thermally conductive via fills for thermally conducting heat from said resistive via fill to the outside of the unitized multilayer circuit structure.

9. The resistor structure of claim 8 wherein said one or more thermally conductive via fills comprises one or more electrically conductive via fills.

10. The resistor structure of claim 8 wherein said one or more thermally conductive via fills comprises one or more metal matrix composite via inserts.

11. A resistor structure in a cofired unitized multilayer circuit structure having a plurality of insulating layers formed of insulating tape, comprising:
    a plurality of resistive via fills comprising the same via fill material formed in respective vias in one of the insulating layers, said vias having substantially the same thickness and having respective cross-sectional areas selected to provide resistance values having predetermined precisely controlled ratios; and
    contact means electrically connected to the tops and bottoms of said plurality of resistive via fills.

12. The resistor structure of claim 11 further including for each of said resistive via fills one or more thermally conductive via fills for thermally conducting heat from said resistive via fill to the outside of the unitized multilayer circuit structure.

13. The resistor structure of claim 11 further including for each of said resistive via fills electrical connection means for allowing electrical connection to selected ones of said contact means from locations on the outside the unitized multilayer circuit structure.

* * * * *